US012685057B2

(12) United States Patent
Huang et al.

(10) Patent No.: US 12,685,057 B2
(45) Date of Patent: Jul. 14, 2026

(54) SEMICONDUCTOR DEVICE AND METHOD OF FORMING THEREOF

(71) Applicant: YANGTZE MEMORY TECHNOLOGIES CO., LTD., Wuhan (CN)

(72) Inventors: Qingyi Huang, Wuhan (CN); Lina Miao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 414 days.

(21) Appl. No.: 18/222,815

(22) Filed: Jul. 17, 2023

(65) Prior Publication Data

US 2024/0379369 A1      Nov. 14, 2024

Related U.S. Application Data

(63) Continuation of application No. PCT/CN2023/093583, filed on May 11, 2023.

(51) Int. Cl.
| | |
|---|---|
| *H01L 23/00* | (2006.01) |
| *H10B 41/27* | (2023.01) |
| *H10B 43/27* | (2023.01) |
| *H10B 80/00* | (2023.01) |
| *H10P 50/00* | (2026.01) |
| *H10P 52/00* | (2026.01) |
| *H10W 78/00* | (2026.01) |
| *H10W 90/00* | (2026.01) |
| *H10W 90/20* | (2026.01) |

(52) U.S. Cl.
CPC ............. *H10P 52/00* (2026.01); *H10B 41/27* (2023.02); *H10B 43/27* (2023.02); *H10B 80/00* (2023.02); *H10P 50/73* (2026.01); *H10W 78/00* (2026.01); *H10W 90/00* (2026.01); *H10W 90/20* (2026.01); *H10W 90/732* (2026.01)

(58) Field of Classification Search
CPC . H01L 21/304; H01L 21/31144; H01L 24/32; H01L 25/0657
See application file for complete search history.

(56) References Cited

U.S. PATENT DOCUMENTS

| | | | | |
|---|---|---|---|---|
| 10,079,194 | B1 * | 9/2018 | Huang | ............... H01L 23/3135 |
| 11,302,600 | B2 * | 4/2022 | Hung | ................... H01L 21/563 |
| 11,984,378 | B2 * | 5/2024 | Yeh | ......................... H01L 24/73 |
| 12,183,714 | B2 * | 12/2024 | Wang | ..................... H01L 24/73 |

(Continued)

FOREIGN PATENT DOCUMENTS

| | | |
|---|---|---|
| CN | 110400800 A | 11/2019 |
| CN | 113380716 A | 9/2021 |

*Primary Examiner* — Thao P Le
(74) *Attorney, Agent, or Firm* — BAYES PLLC

(57) ABSTRACT

The present disclosure provides a semiconductor device and a preparation method thereof. The semiconductor device includes a body structure and an outer edge structure at a periphery of a bottom of the body structure. The body structure includes a top surface and a bottom surface arranged opposite to each other, and a side surface between the top surface and the outer edge structure. The side surface includes a first side surface connected with the outer edge structure, and a lateral distance of the first side surface relative to the outer edge structure gradually decreases along a direction from the top surface to the bottom surface.

19 Claims, 9 Drawing Sheets

(56)        References Cited

U.S. PATENT DOCUMENTS

| 12,388,034 | B2 * | 8/2025 | Chan | ..................... | H01L 23/481 |
|---|---|---|---|---|---|
| 12,457,742 | B2 * | 10/2025 | Matsuno | ............. | H01L 23/5226 |
| 2007/0228010 | A1 * | 10/2007 | Martin | ............. | H01L 21/02087 |
| | | | | | 216/99 |
| 2014/0246227 | A1 * | 9/2014 | Lin | ..................... | H01L 21/4857 |
| | | | | | 174/266 |
| 2022/0068736 | A1 * | 3/2022 | Lo | ........................... | H01L 25/16 |
| 2024/0071847 | A1 * | 2/2024 | Liao | ...................... | H01L 23/053 |
| 2024/0321772 | A1 * | 9/2024 | Lee | .................... | H01L 23/3128 |

* cited by examiner

<u>600</u>

SEMICONDUCTOR DEVICE AND METHOD OF FORMING THEREOF

CROSS-REFERENCE TO RELATED APPLICATIONS

This application is a continuation of International Application No. PCT/CN2023/093583, filed on May 11, 2023, which is incorporated herein by reference in its entirety.

TECHNICAL FIELD

The present disclosure relates to electronic devices, and in some examples, to a semiconductor device and a preparation method thereof.

BACKGROUND

A NAND memory device is a non-volatile memory product designed for low-power consumption and good performance, while being light weight. NAND memory devices have been widely used in electronic products. NAND devices with planar structures are approximating the limit of practical expansion, and in order to further improve the storage capacity and reduce the storage cost-per-bit, a 3D NAND memory was proposed. In a 3D NAND memory structure, a stacked memory structure is realized by vertically stacking multi-layer data memory units.

SUMMARY

According to one aspect of the present disclosure, a semiconductor device is provided. The semiconductor device may include a body structure. The semiconductor device may include an outer edge structure at a periphery of a bottom of the body structure. The body structure may include a top surface and a bottom surface arranged opposite to each other. The body structure may include a side surface between the top surface and the outer edge structure. The side surface may include a first side surface connected with the outer edge structure. A lateral distance of the first side surface relative to the outer edge structure may gradually decrease along a direction from the top surface to the bottom surface.

In some implementations, the body structure may include a carrier. In some implementations, the body structure may include a device structure on the carrier. In some implementations, the outer edge structure may be at a side wall of the carrier. In some implementations, a thickness of the outer edge structure may be less than or equal to a thickness of the carrier.

In some implementations, an orthographic projection of the device structure on the carrier may be within the carrier.

In some implementations, the outer edge structure may include a first surface connected with the side surface. In some implementations, the outer edge structure may include a second surface parallel to the first surface and coplanar with the bottom surface of the body structure. In some implementations, the first side surface may be an inclined surface. In some implementations, an angle between the inclined surface and the first surface may be an obtuse angle.

In some implementations, the first side surface may include a curved surface.

In some implementations, the side surface may further include a second side surface connected with the first side surface. In some implementations, a lateral distance of the second side surface relative to the outer edge structure may gradually decrease along the direction from the top surface to the bottom surface.

In some implementations, the second side surface may be an inclined surface or a curved surface.

In some examples, the second side surface and the first side surface are both inclined surfaces, and an inclination degree of the second side surface is the same as that of the first side surface.

In some implementations, the semiconductor device may include a first semiconductor structure and a second semiconductor structure bonded with each other. In some implementations, the first semiconductor structure may include the carrier and a circuit layer between the carrier and the second semiconductor structure. In some implementations, the circuit layer and the second semiconductor structure may form the device structure.

In some implementations, the top surface of the body structure may be a surface of the second semiconductor structure away from the first semiconductor structure. In some implementations, the bottom surface of the body structure may be a surface of the carrier away from the circuit layer.

In some implementations, the second semiconductor structure may include a memory array connected with the circuit layer.

According to another aspect of the present disclosure, a method of forming a semiconductor device is provided. The method may include forming a body structure and an outer edge structure at a periphery of a bottom of the body structure. The body structure may include a top surface and a bottom surface arranged opposite to each other, and a side surface between the top surface and the outer edge structure. The side surface may include a first side surface close to the outer edge structure. A lateral distance of the first side surface relative to the outer edge structure may gradually decrease along a direction from the top surface to the bottom surface. The method may include sticking an adhesive tape on the body structure and the outer edge structure.

In some implementations, after sticking the adhesive tape on the body structure and the outer edge structure, the method may include grinding and thinning the bottom surface of the body structure and a side of the outer edge structure close to the bottom surface.

In some implementations, the forming the body structure and the outer edge structure at the periphery of the bottom of the body structure may include providing a carrier and the outer edge structure at a side wall of the carrier. In some implementations, the forming the body structure and the outer edge structure at the periphery of the bottom of the body structure may include forming a device structure on the carrier, wherein the carrier and the device structure form the body structure. In some implementations, the forming the body structure and the outer edge structure at the periphery of the bottom of the body structure may include trimming an edge of the body structure to form the side surface.

In some implementations, the forming the device structure on the carrier may include forming a circuit layer on the carrier to form a first semiconductor structure comprising the carrier and the circuit layer. In some implementations, the forming the device structure on the carrier may include providing a second semiconductor structure and bonding the second semiconductor structure with the circuit layer of the first semiconductor structure. In some implementations, the second semiconductor structure may include a memory array and a common source layer connected with the memory array, and a surface of the common source layer away from the first semiconductor structure is the top surface of the body structure. In some implementations, the method may further include forming a photoresist layer on the top surface and the side surface of the body structure. In some implementations, the method may further include performing a photolithography process on the photoresist layer using a mask to form a patterned photoresist layer. In some implementations, the method may further include forming a leading-out contact on the top surface using the patterned photoresist layer.

In some implementations, the semiconductor device may include a plurality of cutting lanes. In some implementations, the method may further include cutting the semiconductor device into a plurality of memory dies along the cutting lanes.

The present disclosure provides a semiconductor device and a method of forming the semiconductor device. The semiconductor device may include a body structure and an outer edge structure at a periphery of a bottom of the body structure. The body structure may include a top surface and a bottom surface arranged opposite to each other, and a side surface between the top surface and the outer edge structure. The side surface may include a first side surface connected with the outer edge structure. A lateral distance of the first side surface relative to the outer edge structure may gradually decrease along a direction from the top surface to the bottom surface. Therefore, a corner between the first side surface of the body structure and the outer edge structure is relatively smooth, which may reduce the gap formed by sticking an adhesive tape at the corner, and thus limiting the impact of subsequent processes on a semiconductor device.

BRIEF DESCRIPTION OF DRAWINGS

The technical solution and other beneficial effects of the present disclosure will be apparent through a detailed description of the examples of the present disclosure in combination with the accompanying drawings.

DETAILED DESCRIPTION

Figure 1:
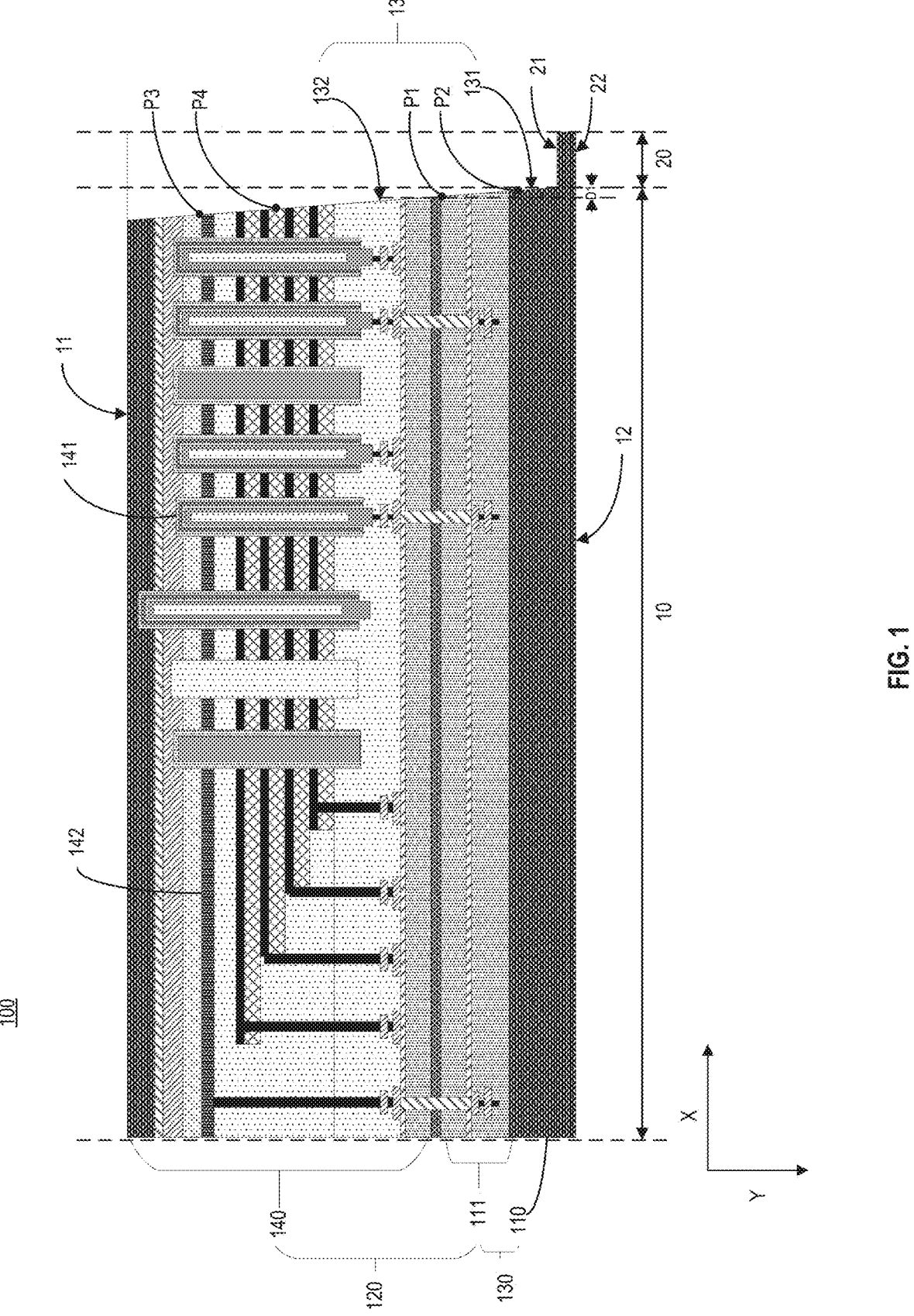
FIG. 1 is a schematic structure diagram of a semiconductor device provided by some examples of the present disclosure.

The technical solution in the examples of the present disclosure will be clearly and completely described below in combination with the accompanying drawings in the example of the present disclosure. Obviously, the described examples are only part of the examples of the present disclosure, but not all of them. Based on the examples in the present disclosure, all other examples obtained by those skilled in the art without creative work fall within the scope of protection of the present disclosure.

It should be understood that although the terms "first", "second", etc. may be used here to describe various components, these components should not be limited to these terms. These terms are used to distinguish one component from another. For example, the first component may be referred to as the second component, and similarly, the second component may be referred to as the first component without departing from the scope of the present disclosure.

It should be understood that when a component is called "on" or "connected to" another component, it can be directly on or connected to another component, or there can also be an interposed component. Other terms used to describe the relationship between components should be interpreted in a similar manner.

As used herein, the term "layer" refers to a portion of material comprising an area having a thickness. The layer may extend over the entire underlying or overlying structure, or may have a range smaller than the range of the underlying or overlying structure. Further, the layer may be an area of a homogeneous or inhomogeneous continuous structure with a thickness less than that of the continuous structure. For example, a layer can be located between any pair of horizontal planes between, or at, a top surface and a bottom surface of the continuous structure. The layer may extend horizontally, vertically and/or along a tapered surface. The substrate may be a layer, which may include one or more layers therein, and/or may have one or more layers thereon, there above and/or there below. Layers can include multiple layers. For example, the interconnection layer may include one or more conductive layers and contact layers (in which contacts, interconnects, and/or vertical interconnect access (VIA) are formed) and one or more dielectric layers.

As used herein, the term "semiconductor device" refers to a semiconductor device having a vertically oriented array structure on a laterally oriented substrate such that the array structure extends in a vertical direction relative to the substrate.

It should be noted that the illustration provided in the example of the present disclosure only illustrates the basic concept of the present disclosure in a schematic manner. Although the illustration only shows the components related to the present disclosure rather than drawing according to the number, shape and size of components in the actual implementation, the state, number and proportion of components in the actual implementation can be changed at will, and the component layout state may also be more complex.

In the preparation process, a wafer is prepared first. Then, the wafer is cut into multiple memory dies along a cutting lane. When preparing bonded wafers, the edges of bonded wafers are cut. A cutting surface formed by some cutting processes may cause adverse effects on the device during a subsequent process.

To overcome these and other challenges, the present disclosure provides a semiconductor device and a method of manufacture that creates smoother corner between a side surface of the body structure and the outer edge structure, thereby reducing the impact of subsequent processes on the semiconductor device.

Referring to FIG. 1, which is a schematic structure diagram of a semiconductor device provided by some examples of the present disclosure. The semiconductor device 100 may be a wafer, which can be cut to form a plurality of memory dies, such as a three-dimensional memory. The three-dimensional memory can be used in communication products, consumer electronic products, automotive products, aerospace products, artificial intelligence products or big data. The consumer electronic products may include, but are not limited to, mobile phones, computers, tablets, cameras, smart glasses, or game products, and the like.

The semiconductor device 100 may include a body structure 10 and an outer edge structure 20. The outer edge structure 20 may be located at the periphery of the bottom of the body structure 10. In some examples, the outer edge structure 20 extends laterally (X) from the bottom edge of the body structure 10 to protrude from the body structure 10. As used herein, the term "body structure" may refer to the internal main structure of an entire wafer. The term "outer edge structure" may refer to the outer edge or edge of the entire wafer, rather than the outer edge of a single memory die, in some examples.

Still referring to FIG. 1, the body structure 10 may include a top surface 11 and a bottom surface 12 arranged opposite to each other, and a side surface 13 located between the top surface 11 and the outer edge structure 20. The top surface 11 and the bottom surface 12 can be arranged parallel to each other. The side surface 13 may include a first side surface 131 connected with the outer edge structure 20. A lateral distance D1 of the first side surface 131 relative to the outer edge structure 20 may gradually decrease along a direction from the top surface 11 to the bottom surface 12. For example, the direction of the top surface 11 to the bottom surface 12 is Y. The first side surface 131 may have a position P1 and a position P2 sequentially along the Y direction. In this case, the lateral distance D1 from P1 to the outer edge structure 20 may be greater than the lateral distance from P2 to the outer edge structure 20. For clarity of illustration, only the lateral distance D1 from P1 to the outer edge structure 20 is shown.

In some examples, the top views of the top surface 11 and the bottom surface 12 may both be circular shapes, and the area of the bottom surface 12 may be larger than that of the top surface 11. That is, the orthographic projection of the top surface 11 on the bottom surface 12 may be located within the bottom surface 12. The top of the side surface 13 is arranged around the top surface 11 such that it connects with the top surface 11. The bottom of the side surface 13 may also form a circular shape.

It should be noted that the top surface 11 and the bottom surface 12 may refer to the relative orientations shown in the Figures. If the overall structure is inverted, the top surface 11 may be referred to as the bottom surface, and the bottom surface 12 may be referred to as the top surface. FIG. 1 is a cross-section view of the semiconductor device 100 along the XY direction and the side surface 13 refers to the side surface of the cross-section. In fact, in the stereo-structure, the side surface of the semiconductor device 100 may be a continuous surface formed by the side surface 13, such as a side surface of a circular table.

In some examples, the side surface 13 may include a second side surface 132 connected with the first side surface 131. The lateral distance of the second side surface 132 relative to the outer edge structure 20 may gradually decrease along the direction from the top surface 11 to the bottom surface 12. For example, if the second side surface 132 has position P3 and position P4 sequentially along the Y direction, the lateral distance from P3 to the outer edge structure 20 may be greater than that from P4 to the outer edge structure 20.

In some examples, the first side surface 131 may include at least one of an inclined surface and a curved surface. The second side surface 132 may include at least one of an inclined surface and a curved surface. For example, as shown in FIG. 1, the first side surface 131 is an inclined surface and the second side surface 132 is an inclined surface, and the inclination degree of the first side surface 131 and the second side surface 132 is the same. In other words, the first side surface 131 and the second side surface 132 are coplanar. Since the first side surface 131 and the second side surface 132 are coplanar, the junction line between the first side surface 131 and the second side surface 132 may be located anywhere on the side surface 13.

When the first side surface 131 and the second side surface 132 are inclined surfaces and coplanar, the side surface 13 formed by the first side surface 131 and the second side surface 132 may be the side surface of a circular table. In some examples, the first side surface 131 may be an inclined surface such that the angle between the inclined surface and the first surface 21 is an obtuse angle.

In some examples, the inclined surface may include of a plurality of continuous small steps.

The outer edge structure 20 may include a first surface 21 and a second surface 22 parallel to each other, and the first surface 21 is connected with the side surface 13. That is, the first surface 21 may connected with the first side surface 131. The second surface 22 may be coplanar with the bottom surface 12 of the body structure 10, such that the bottom surface of the outer edge structure 20 is coplanar with the bottom surface 12 of the body structure 10.

The body structure 10 may include a carrier 110 and a device structure 120. The device structure 120 may be located on the carrier 110. The outer edge structure 20 may be located on the side wall of the carrier 110, and the thickness of the outer edge structure 20 in the Y direction is less than or equal to the thickness of the carrier 110 in the Y direction. As shown in FIG. 1, the thickness of the outer edge structure 20 is less than that of the carrier 110, so the first side surface 131 includes a side surface of a part of the carrier 110.

In some examples, the orthographic projection of the device structure 120 on the carrier 110 may be located within the carrier 110.

In some examples, the semiconductor device 100 may include a first semiconductor structure 130 and a second semiconductor structure 140 bonded to each other. The first semiconductor structure 130 may include a carrier 110 and a circuit layer 111 between the carrier 110 and the second semiconductor structure 140. The circuit layer 111 and the second semiconductor structure 140 form the device structure 120. The device structure 120 may include a bonding layer between the circuit layer 111 and the second semiconductor structure 140.

The top surface 11 of the body structure 10 may be the surface of the second semiconductor structure 140 away from the first semiconductor structure 130. The bottom surface 12 of the body structure 10 may be the surface of the carrier 110 away from the circuit layer 111.

The circuit layer 111 in the first semiconductor structure 130 may be a complementary metal oxide semiconductor (CMOS). The second semiconductor structure 140 may include a memory array connected to the circuit layer 111. The memory array may include a stacking structure and a storage channel structure 141 penetrating through the stacking structure along a stacking direction (Y) of the stacking structure, and the stacking structure includes alternately stacked gate layers and insulating layers. The second semiconductor structure 140 may include a common source layer 142 connected to one end of the storage channel structure 141. The other end of the storage channel structure 141 may be connected to the circuit layer 111, such that the common source layer 142 is also connected to the circuit layer 111.

It should be noted that the Figures only show the memory array in one memory die in the wafer. In fact, there may be multiple memory dies in the wafer. The present disclosure does not limit the number of memory dies in the wafer.

In some examples, the semiconductor device 100 may further include a third semiconductor structure (not shown in the Figs.) that includes a memory array. The third semiconductor structure may be bonded to the first semiconductor structure 130.

In some examples, the semiconductor device 100 may also include a fourth semiconductor structure (not shown in the Figs.). The fourth semiconductor structure may include a circuit layer such as CMOS. The fourth semiconductor structure may be bonded to a side of the second semiconductor structure 140 away from the first semiconductor structure 130.

Figure 2:
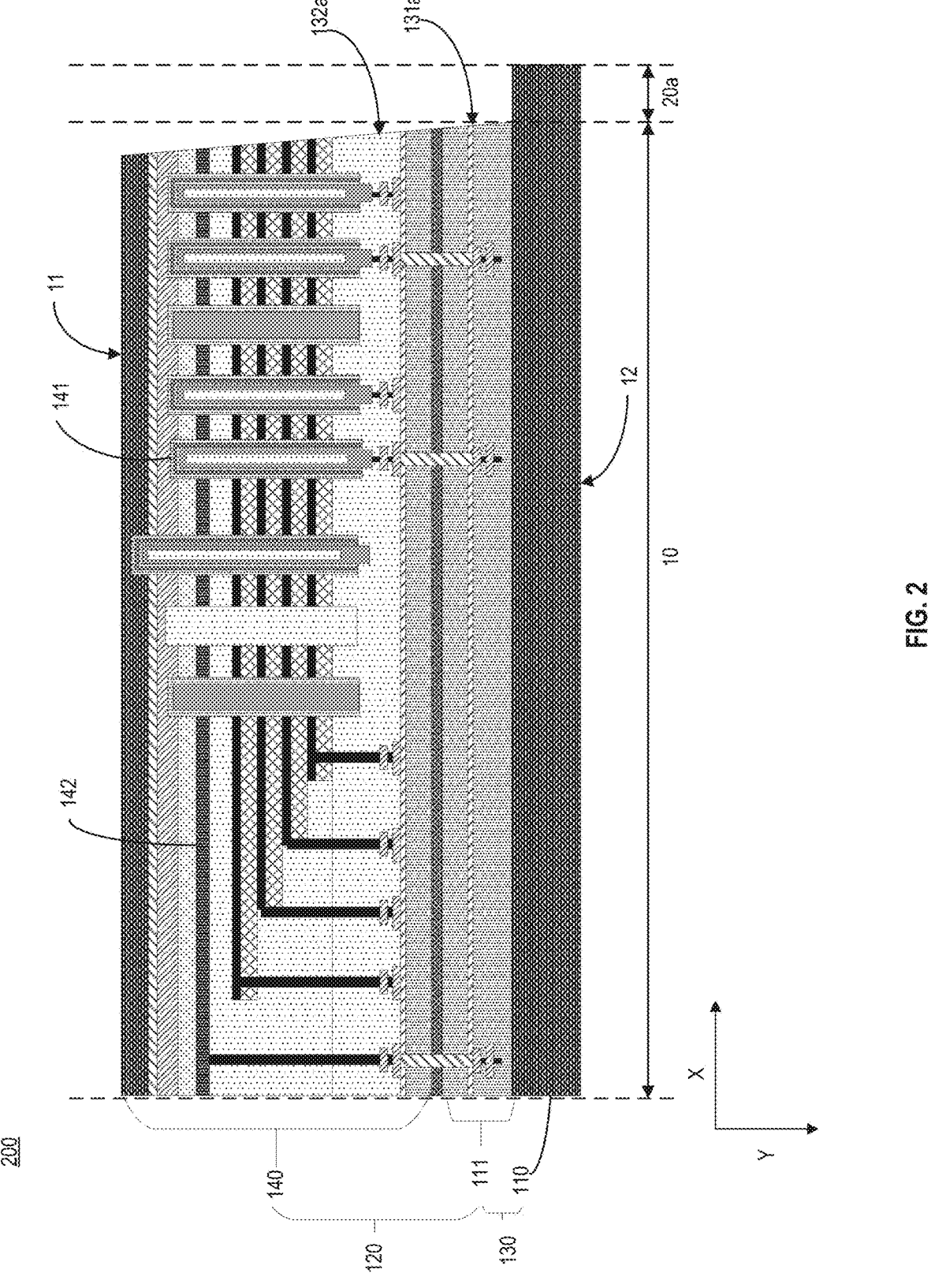
FIG. 2 is a schematic structure diagram of a semiconductor device provided by some examples of the present disclosure.

Referring to FIG. 2, which is a schematic structure diagram of a semiconductor device provided by some examples of the present disclosure. In order to facilitate understanding and brief description, the same reference number continues for the same structure in FIG. 2 as were used above in the description of FIG. 1. The same structure will not be described in detail again in connection with FIG. 2, and this example only describes different structures in detail.

In the semiconductor device 200, the first side surface 131*a* and the second side surface 132*a* are both inclined surfaces, and the inclination degrees of the first side surface 131*a* and the second side surface 132*a* are the same. The thickness of the outer edge structure 20*a* is equal to the thickness of the carrier 110, so that the first side surface 131*a* only includes the side surface 13 of the device structure 120. The difference between FIG. 2 and FIG. 1 is the depth of the first side surface 131*a*. In the example of FIG. 2, the bottom of the first side surface 131*a* is flush with the bottom of the device structure 120. Conversely, in the example of FIG. 1, the bottom of the first side surface 131 extends below the bottom of the device structure 120.

Figure 3:
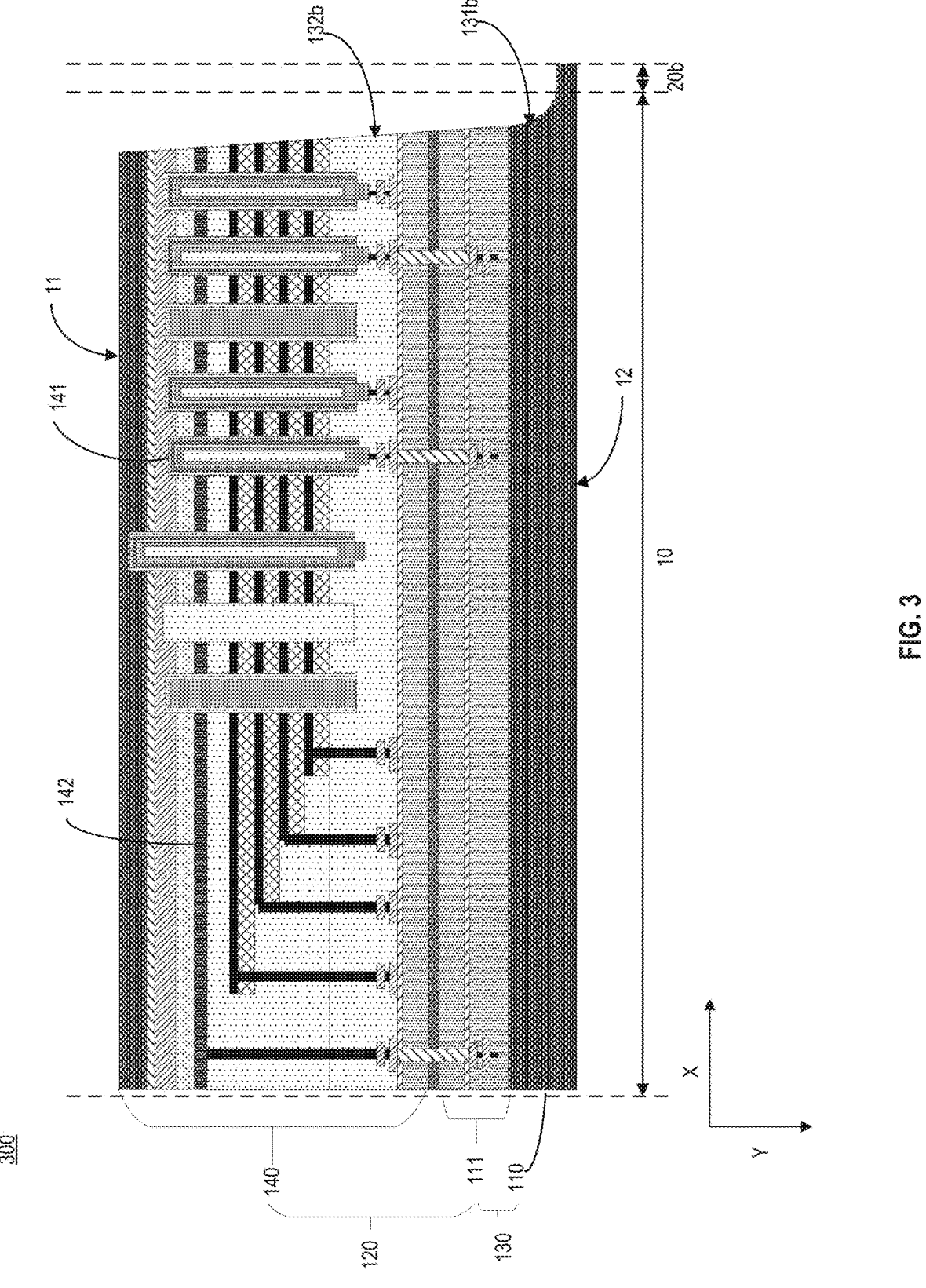
FIG. 3 is a schematic structure diagram of a semiconductor device provided by some examples of the present disclosure.

Referring to FIG. 3, which is a schematic structure diagram of a semiconductor device provided by some examples of the present disclosure. In order to facilitate understanding and brief description, the same reference number continues for the same structure in FIG. 3 as were used above in the description(s) of FIGS. 1 and/or 2. The same structure will not be described in detail again in connection with FIG. 3, and this example only describes different structures in detail.

In the semiconductor device 300, the first side surface 131*b* is a curved surface, and the second side surface 132*b* is an inclined surface. The thickness of the outer edge structure 20*b* is less than that of the carrier 110. The first side surface 131*b* may include a side surface of a part of the carrier 110. The second side surface 132*b* may include the side surface of the device structure 120, so the junction of the first side surface 131*b* and the second side surface 132*b* is the junction of the carrier 110 and the device structure 120.

In some examples, the lateral distance of the second side surface 132*b* relative to the outer edge structure 20*b* may be greater than that of the first side surface 131*b* relative the outer edge structure 20*b*.

Figure 4:
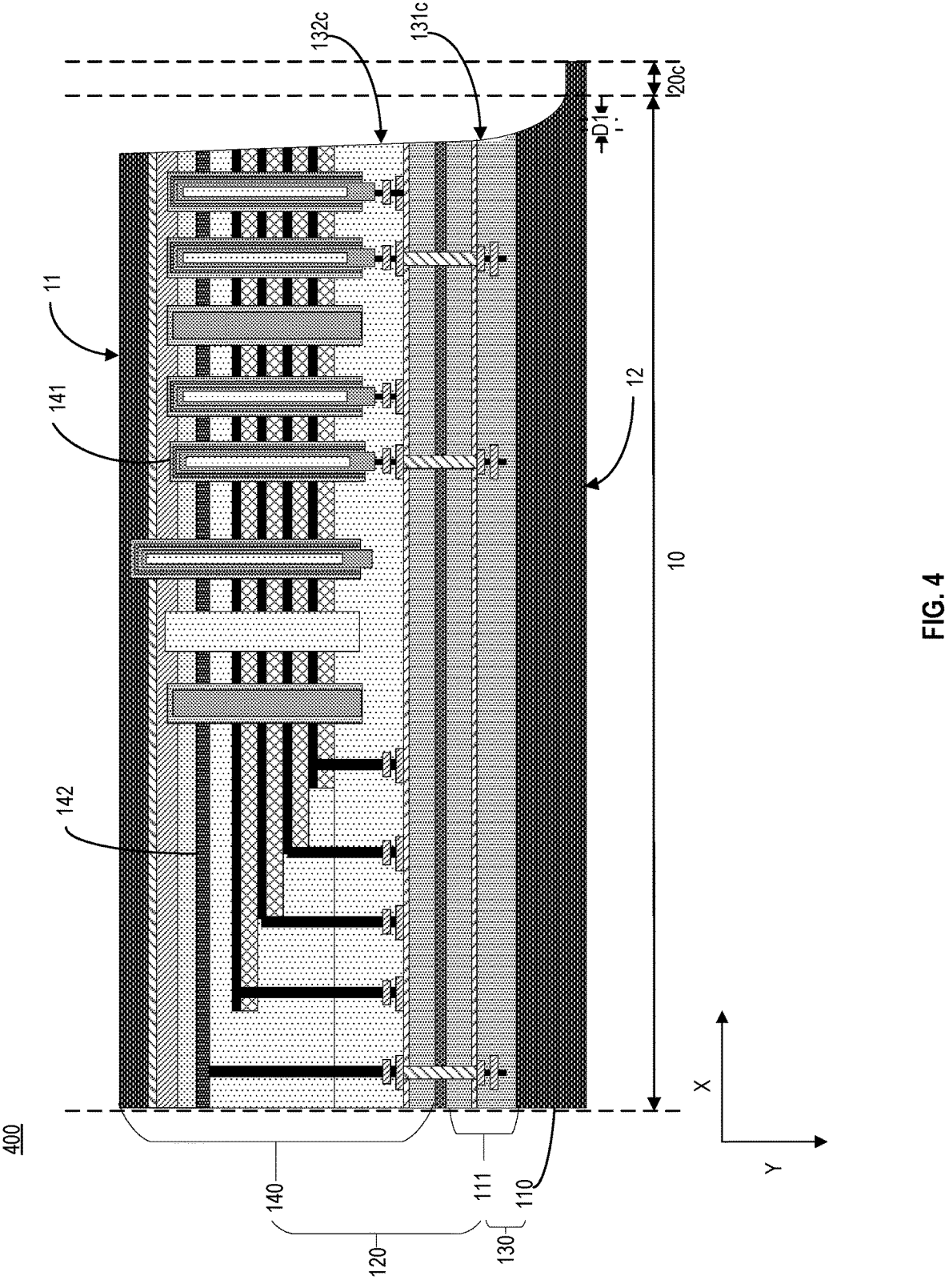
FIG. 4 is a schematic structure diagram of a semiconductor device provided by some examples of the present disclosure.

Referring to FIG. 4, which is a schematic structure diagram of a semiconductor device provided by some examples of the present disclosure. In order to facilitate understanding and brief description, the same reference number continues for the same structure in FIG. 4 as were used above in the description(s) of FIGS. 1, 2, and/or 3. The same structure will not be described in detail again in connection with FIG. 4, and this example only describes different structures in detail.

In the semiconductor device 400, the first side surface 131*c* is a curved surface, and the second side surface 132*c* is an inclined surface. The thickness of the outer edge structure 20*c* is less than that of the carrier 110. The first side surface 131*c* may extend from the carrier 110 to the circuit layer 111. The second side surface 132*c* may include the side surface of the second semiconductor structure 140. The junction of the first side surface 131*c* and the second side surface 132*c* can be the bottom of the second semiconductor structure 140. The first side surface 131*c* or the second side surface 132*c* may include a bonding layer.

In some examples, the lateral distance of the second side surface 132*c* relative to the outer edge structure 20 may be greater than that of the first side surface 131*c* relative to the outer edge structure 20.

Figure 5:
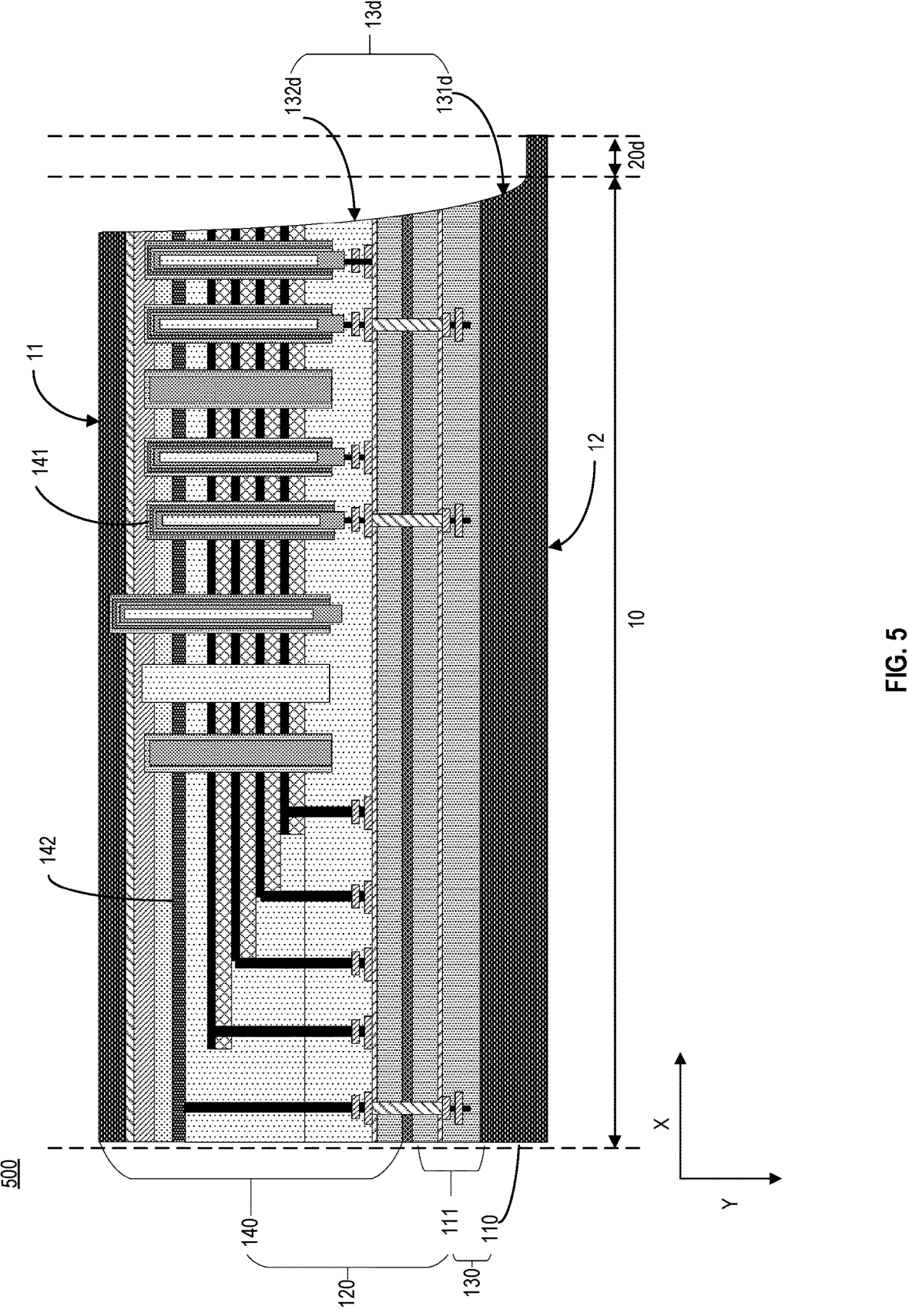
FIG. 5 is a schematic structure diagram of a semiconductor device provided by some examples of the present disclosure.

Referring to FIG. 5, which is a schematic structure diagram of a semiconductor device provided by some examples of the present disclosure. In order to facilitate understanding and brief description, the same reference number continues for the same structure in FIG. 5 as were used above in the description(s) of FIGS. 1, 2, 3, and/or 4. The same structure will not be described in detail again in connection with FIG. 5, and this example only describes different structures in detail.

In the semiconductor device 500, the first side surface 131*d* is a curved surface, and the second side surface 132*d* is a curved surface. The thickness of the outer edge structure 20*d* may be less than that of the carrier 110. The first side surface 131*d* may include a side surface of a part of the carrier 110. The second side surface 132*d* may include a side surface of a part of the second semiconductor structure 140.

In some examples, the first side surface 131*d* and the second side surface 132*d* may form a continuous curved surface. Here, the junction of the first side surface 131*d* and the second side surface 132*d* can be at any position of the side surface 13*d*.

The semiconductor device provided by the examples of the present disclosure includes a body structure 10 and an outer edge structure. The outer edge structure may be located at the periphery of the bottom of the body structure 10. The body structure 10 may include a top surface 11 and a bottom surface 12 arranged opposite to each other. A side surface between the top surface 11 and the outer edge structure 20. The side surface may include a first side surface connected with the outer edge structure 20. A lateral distance of the first side surface relative to the outer edge structure may gradually decrease along a direction from the top surface 11 to the bottom surface 12. This renders the corner between the first side surface and the outer edge structure of the body structure 10 relatively smooth, which is conducive to reducing the gap formed by sticking an adhesive tape at the corner. This may limit the impact of subsequent processes on the semiconductor device.

Figure 6:
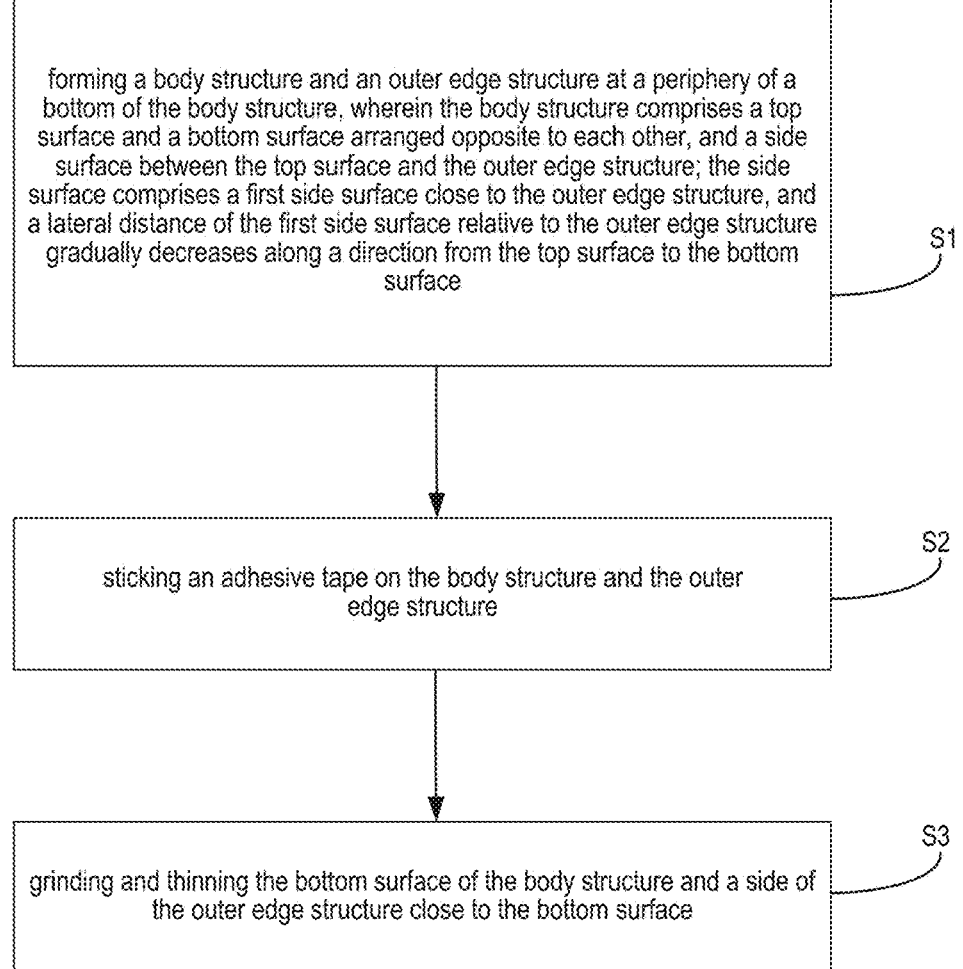
FIG. 6 is a schematic flowchart of a method of forming a semiconductor device provided by some examples of the present disclosure.

Referring to FIG. 6, a schematic flowchart of the method of forming semiconductor devices provided by some examples of the present disclosure is shown. Referring to FIG. 6 and FIGS. 7a-7d together, FIGS. 7a-7d are the schematic structure diagrams of the semiconductor device provided by some examples of the present disclosure corresponding to the method shown in FIG. 6 in the relevant semiconductor manufacturing process. To illustrate the structure changes of the semiconductor device during the preparation process, FIGS. 7a-7d only show the simple structure composition of the semiconductor device during the preparation process. This example takes the preparation of the above semiconductor device 100 as an example to explain the preparation method of the semiconductor device. The preparation method of the semiconductor device may include operations S1-S3.

At operation S1, the method may include forming the body structure 10 and the outer edge structure 20 located at the periphery of the bottom of the body structure 10. The body structure 10 may include a top surface 11 and a bottom surface 12 arranged opposite each other. A side surface 13 may be located between the top surface 11 and the outer edge structure 20. The side surface 13 may include a first side surface 131 close to the outer edge structure 20. A lateral distance of the first side surface 131 relative to the outer edge structure 20 may gradually decrease along a direction from the top surface 11 to the bottom surface 12.

Operation S1 may include the following operations.

Figure 7A:
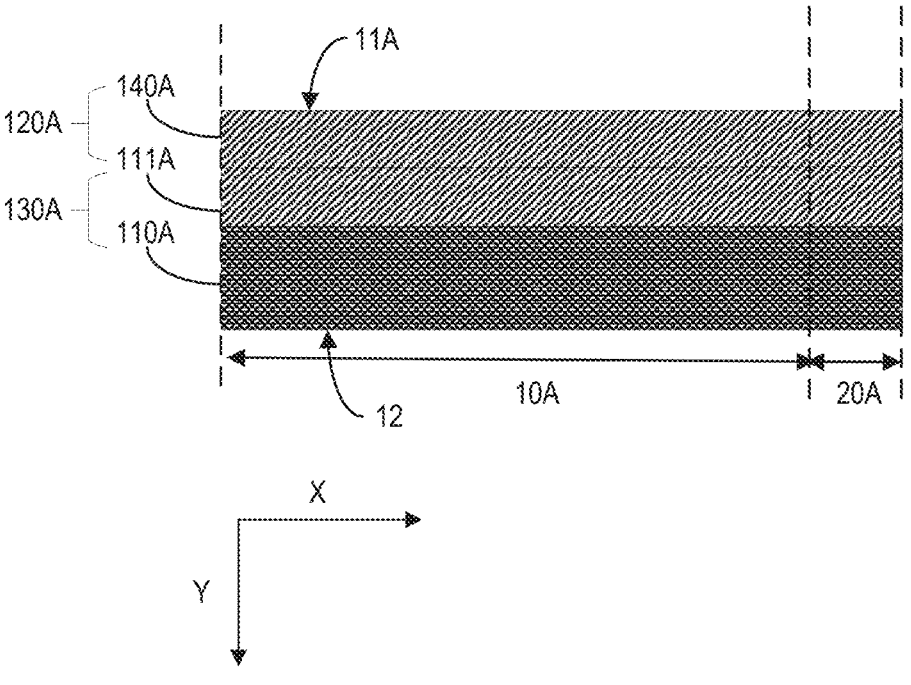
FIGS. 7a-7d are schematic structure diagrams of the semiconductor device provided by some examples of the present disclosure corresponding to the method shown in FIG. 6 in the relevant preparation process.

For example, in a first operation associated with S1, a carrier 110A and an outer edge structure 20A located on the side wall of the carrier 110A are provided. As shown in FIG. 7a, the carrier 110A and the outer edge structure 20A may form one substrate that includes the carrier 110A and the outer edge structure 20A located on the side wall of the carrier 110A.

The substrate may be a semiconductor substrate, such as silicon (Si), germanium (Ge), SiGe substrate, silicon on insulator (SOI) or germanium on insulator (GOI), etc. In other examples, the semiconductor substrate can may be a substrate that includes other element semiconductors or compound semiconductors, or includes a laminated structure, such as Si/SiGe.

In a second operation associated with S1, a device structure 120A may be formed on the carrier 110A. The carrier 110A and the device structure 120A may form the body structure 10A.

In some examples, a circuit layer 111A may be formed on the carrier 110A to form a first semiconductor structure 130A that includes the carrier 110A and the circuit layer 111A. Then, a second semiconductor structure 140A (e.g., CMOS) may be provided, and the second semiconductor structure 140A may be bonded to the circuit layer 111A of the first semiconductor structure 130A. The device structure 120A may include a circuit layer 111A and a second semiconductor structure 140A. The body structure 10A may include a top surface 11A and a bottom surface 12 arranged opposite to each other.

In a third operation associated with S1, the edge of the body structure 10A may be trimmed to form the side surface 13.

Figure 7B:
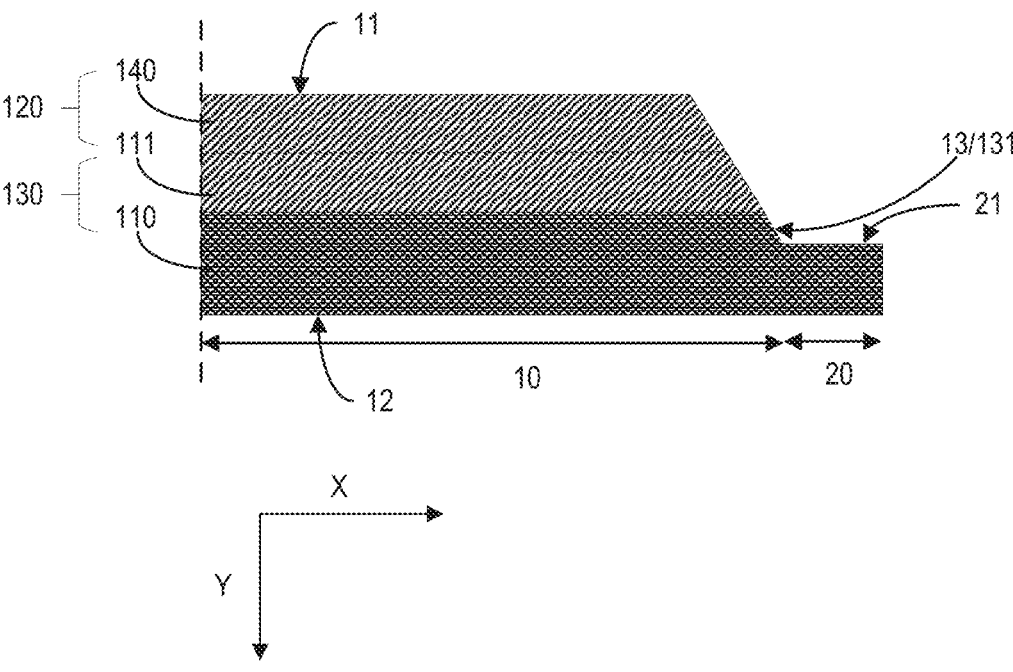

As shown in FIG. 7b, the edge part of the body structure 10A may be cut along the Y direction. The semiconductor device may be moved in the opposite direction of X during the cutting process to form the side surface 13. Then, the outer edge structure 20A may be cut along the opposite direction of X to form the outer edge structure 20, which is connected to the side surface 13. After cutting, the structures of the body structure 10, the top surface 11, the carrier 110, the circuit layer 111, the second semiconductor structure 140, the first semiconductor structure 130, and the second semiconductor structure 140 may be formed, are as shown in FIG. 7b.

At operation S2, the method may include attaching (e.g., placing, sticking, adhering) an adhesive tape 30 to the body structure 10 and the outer edge structure 20.

Figures 7C, 7D:
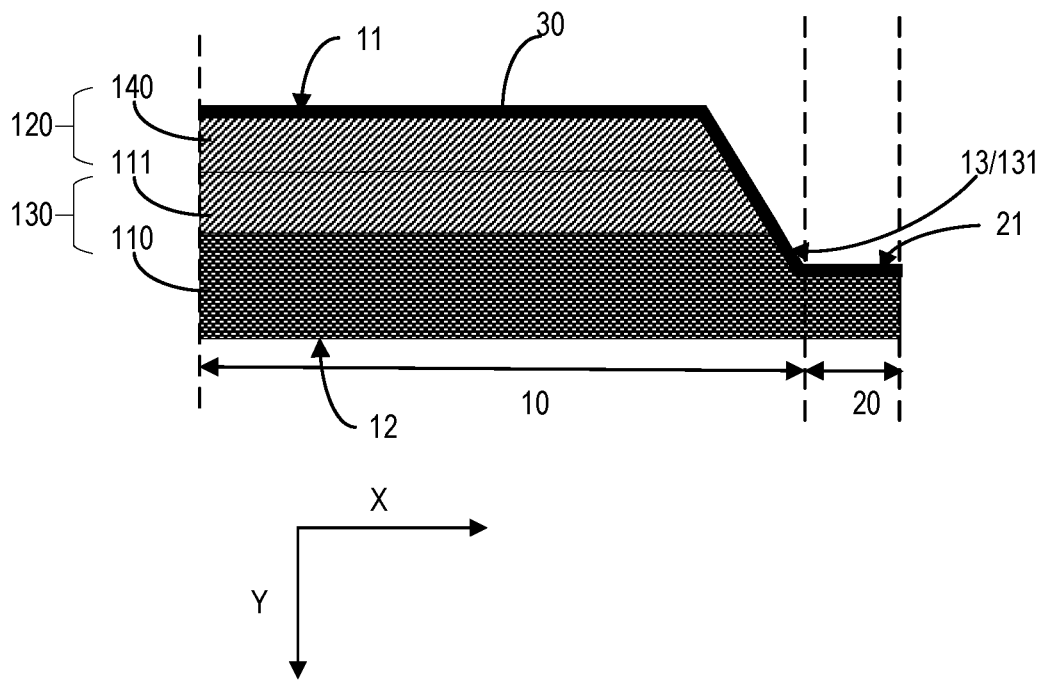

As shown in FIG. 7c, the adhesive tape 30 may be attached on the body structure 10 and the outer edge structure 20. Because the lateral distance of the first side surface 131 relative to the outer edge structure 20 gradually decreases along the Y direction, the corner between the first side surface 131 and the first surface 21 of the outer edge structure 20 may be relatively smooth. Consequently, the adhesive tape 30 can be tightly fixed at the corner, thereby limiting the gap of the adhesive tape 30 at the corner.

At operation S3, the method may include grinding and/or thinning the bottom surface 12 of the body structure 10 and a side of the outer edge structure 20 close to the bottom surface 12.

As shown in FIG. 7d, the semiconductor device may be inverted and placed in a vacuum adsorption area (VA) of a grinding machine for fixation. The bottom surface 12 of the body structure 10 and the side of the outer edge structure 20 close to the bottom surface 12 are ground to thin the carrier 110 and the outer edge structure 20. The main function of the adhesive tape 30 is to protect the structure on the other side, such as the circuit layer 111 and the second semiconductor structure 140, during transportation and grinding.

After operation S3, the method may include turning over the semiconductor device. The method of forming the semiconductor device may further include, e.g., 1) forming a photoresist layer (not shown in the Figs.) on the top surface 11 and the side surface 13 of the body structure 10; 2) performing photolithography process on the photoresist layer using a mask to form a patterned photoresist layer; 3) forming an leading-out contact using the patterned photoresist layer. For example, the leading-out contact may include a source leading-out contact, a silicon through contact, and some other contact structures that need to be formed using a patterned photoresist layer to etch. In the process of forming the leading-out contact, the photoresist layer may be formed on the side surface 13. Because the corner between the side surface 13 and the first surface 21 is relatively smooth, the accumulation of the photoresist layer on the side surface 13 may be reduced, thus the formation of bulges on the side surface 13 may be mitigated.

In some examples, the semiconductor device may include a plurality of cutting lanes inside. Here, the method of forming the semiconductor device may include cutting the semiconductor device into a plurality of memory-dies along the cutting lanes. Because the quality of the memory-dies at the edge of the semiconductor device (such as the memory dies close to the side surface 13) is poor, in order to ensure the quality of these structures, the memory dies cut from the middle of the semiconductor device can be selected for use.

If the corner between the first side surface 131 and the outer edge structure 20 is a right angle, a gap may easily form when the adhesive tape 30 is stuck at the corner. Then, during the grinding process, the gap may lead to an overall stress mismatch. This may cause structure cracking and the generation of fragments. The generated fragments may cause damage to the circuit layer 111 during the grinding process.

In the method of forming the semiconductor device provided by the example of the present disclosure, the lateral distance of the first side surface 131 formed by the body structure 10 relative to the outer edge structure 20 gradually decreases along the direction from the top surface 11 to the bottom surface 12. The corner between the first side surface 131 formed by cutting and the outer edge structure 20 is not a right angle and is relatively smooth. Consequently, the adhesive tape 30 can be attached at the corner with a high-degree of precision. Therefore, the gap of the adhesive tape 30 at the corner may be reduced, which can alleviate the problem of stress mismatch, reduce the generation of frag-ments, and thus, reduce the damage to the circuit layer 111 during the grinding process.

Some examples of the present disclosure further provide a memory, which is prepared by the preparation method of the semiconductor device in any of the above examples, and the memory may include the memory dies in the above examples. The memory can be a three-dimension memory, such as a 3D NAND or 3D nor memory.

Figure 8:
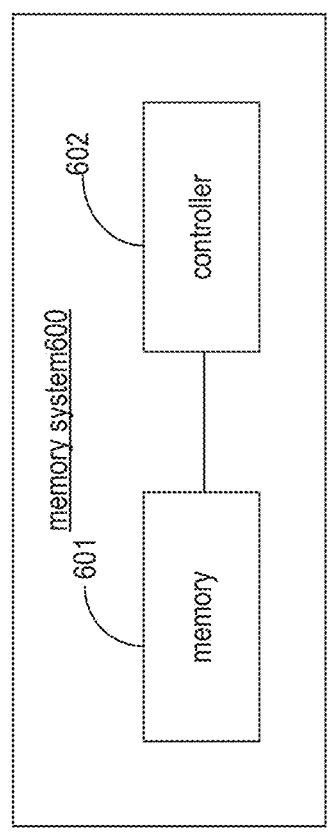
FIG. 8 is a schematic structure diagram of a memory system provided by some examples of the present disclosure.

Referring to FIG. 8, a schematic structure diagram of a memory system provided by some examples of the present disclosure is shown. The memory system 600 may include a memory 601 and a controller 602. The memory 601 may be a memory in the above examples, and the memory 601 may include memory dies in the above examples. The controller 602 is electrically connected with the memory 601 to control the memory 601 to store data, and the memory 601 can perform the operation of storing data based on the control of the controller 602.

In some examples, the memory system 600 may be implemented as a universal flash memory (UFS) device, a solid-state hard disk (SSD), a multimedia card in the form of MMC, eMMC, RS-MMC, and micro MMC, a secure digital card in the form of SD, mini SD, and micro SD, a personal computer Memory Card International Association (PCM-CIA) card type storage device, a peripheral component interconnect (PCI) type storage device, and a high-speed PCI (PCI-E) type storage device, compact flash memory (CF) card, smart media card or memory stick, etc.

The description of the above examples is only used to help understand the technical solution of the present disclosure and its core idea. Those of ordinary skill in the art should understand that they can still modify the technical solutions recited in the above examples, or make equivalent replace-ments for some of the technical features; and these modifi-cations or replacements do not make the essence of the corresponding technical solution departed from the scope of the technical solutions of the various examples of the present disclosure.

What is claimed is:

1. A semiconductor device, comprising:
a body structure; and
an outer edge structure at a periphery of a bottom of the body structure,
    wherein the body structure comprises a top surface and a bottom surface arranged opposite to each other, and a side surface between the top surface and the outer edge structure,
    wherein the side surface comprises a first side surface connected with the outer edge structure,
    wherein a lateral distance of the first side surface relative to the outer edge structure gradually decreases along a direction from the top surface to the bottom surface, and
    wherein the outer edge structure comprises:
    a first surface connected with the side surface; and a second surface parallel to the first surface and coplanar with the bottom surface of the body structure,
    wherein the first side surface is an inclined surface, and
    wherein an angle between the inclined surface and the first surface is an obtuse angle.

2. The semiconductor device according to claim 1, wherein the body structure comprises:
a carrier; and
a device structure on the carrier,
    wherein the outer edge structure is at a side wall of the carrier, and a thickness of the outer edge structure is less than or equal to a thickness of the carrier.

3. The semiconductor device according to claim 2, wherein an orthographic projection of the device structure on the carrier is within the carrier.

4. The semiconductor device according to claim 1, wherein the first side surface comprises a curved surface.

5. The semiconductor device according to claim 1, wherein:
    the side surface further comprises a second side surface connected with the first side surface, and
    a lateral distance of the second side surface relative to the outer edge structure gradually decreases along the direction from the top surface to the bottom surface.

6. The semiconductor device according to claim 5, wherein the second side surface is an inclined surface or a curved surface.

7. The semiconductor device according to claim 6, wherein the second side surface and the first side surface are both inclined surfaces, and an inclination degree of the second side surface is the same as that of the first side surface.

8. The semiconductor device according to claim 2, wherein:
    the semiconductor device comprises a first semiconductor structure and a second semiconductor structure bonded with each other,
    the first semiconductor structure comprises the carrier and a circuit layer between the carrier and the second semiconductor structure, and
    the circuit layer and the second semiconductor structure form the device structure.

9. The semiconductor device according to claim 8, wherein:
    the top surface of the body structure is a surface of the second semiconductor structure away from the first semiconductor structure, and
    the bottom surface of the body structure is a surface of the carrier away from the circuit layer.

10. The semiconductor device according to claim 8, wherein the second semiconductor structure comprises a memory array connected with the circuit layer.

11. A method of forming a semiconductor device, com-prising:
    forming a body structure and an outer edge structure at a periphery of a bottom of the body structure; and
    sticking an adhesive tape on the body structure and the outer edge structure,
    wherein the body structure comprises a top surface and a bottom surface arranged opposite to each other, and a side surface between the top surface and the outer edge structure,
    wherein the side surface comprises a first side surface proximate to the outer edge structure, wherein the first side surface comprises a curved surface, and wherein a lateral distance of the first side surface relative to the outer edge structure gradually decreases along a direction from the top surface to the bottom surface.

12. The method of claim 11, wherein, after sticking the adhesive tape on the body structure and the outer edge structure, the method further comprises:

grinding and thinning the bottom surface of the body structure and a side of the outer edge structure proximate to the bottom surface.

13. The method of claim 11, wherein the forming the body structure and the outer edge structure at the periphery of the bottom of the body structure comprises:

providing a carrier and the outer edge structure at a side wall of the carrier;

forming a device structure on the carrier, the carrier and the device structure forming the body structure; and trimming an edge of the body structure to form the side surface.

14. The method of claim 13, wherein the forming the device structure on the carrier comprises:

forming a circuit layer on the carrier to form a first semiconductor structure comprising the carrier and the circuit layer; and providing a second semiconductor structure and bonding the second semiconductor structure with the circuit layer of the first semiconductor structure.

15. The method of claim 14, wherein:

the second semiconductor structure comprises a memory array and a common source layer connected with the memory array, a surface of the common source layer away from the first semiconductor structure is the top surface of the body structure, and the method further comprises:

forming a photoresist layer on the top surface and the side surface of the body structure;

performing a photolithography process on the photoresist layer using a mask to form a patterned photoresist layer; and forming a leading-out contact on the top surface using the patterned photoresist layer.

16. The method of claim 11, wherein:

the semiconductor device comprises a plurality of cutting lanes, and the method further comprises:

cutting the semiconductor device into a plurality of memory dies along the plurality of cutting lanes.

17. A method of forming a semiconductor device, comprising:

providing a carrier and an outer edge structure at a side wall of the carrier;

forming a device structure on the carrier, the carrier and the device structure forming a body structure;

trimming an edge of the body structure to form a side surface; and sticking an adhesive tape on the body structure and the outer edge structure, wherein the body structure comprises a top surface and a bottom surface arranged opposite to each other, wherein the side surface is positioned between the top surface and the outer edge structure, wherein the side surface comprises a first side surface proximate to the outer edge structure, and wherein a lateral distance of the first side surface relative to the outer edge structure gradually decreases along a direction from the top surface to the bottom surface.

18. The method of claim 17, wherein the forming the device structure on the carrier comprises:

forming a circuit layer on the carrier to form a first semiconductor structure comprising the carrier and the circuit layer; and providing a second semiconductor structure and bonding the second semiconductor structure with the circuit layer of the first semiconductor structure.

19. The method of claim 18, wherein:

the second semiconductor structure comprises a memory array and a common source layer connected with the memory array, a surface of the common source layer away from the first semiconductor structure is the top surface of the body structure, and the method further comprises:

forming a photoresist layer on the top surface and the side surface of the body structure;

performing a photolithography process on the photoresist layer using a mask to form a patterned photoresist layer; and forming a leading-out contact on the top surface using the patterned photoresist layer.

* * * * *